United States Patent [19]

Kecmer et al.

[11] Patent Number: 5,607,273
[45] Date of Patent: Mar. 4, 1997

[54] PRINTED CIRCUIT BOARD WEDGE SECTION RETAINER

[75] Inventors: Robert P. Kecmer, Fair Lawn; James B. Barnes, Mendham, both of N.J.

[73] Assignee: VSI Corporation, Chantilly, Va.

[21] Appl. No.: 554,055

[22] Filed: Nov. 6, 1995

[51] Int. Cl.$^6$ .................................................. F16B 13/04
[52] U.S. Cl. .............................. 411/79; 411/24; 411/80
[58] Field of Search .............................. 411/24, 25, 26, 411/75, 77, 80, 79

[56] References Cited

U.S. PATENT DOCUMENTS

| | | | |
|---|---|---|---|
| 4,824,303 | 4/1989 | Dinger | 411/80 X |
| 5,156,647 | 10/1992 | Ries | 411/80 X |
| 5,253,963 | 10/1993 | Ries | 411/80 X |

FOREIGN PATENT DOCUMENTS

| | | | |
|---|---|---|---|
| 536310 | 1/1957 | Canada | 411/80 |
| 1052601 | 12/1966 | United Kingdom | 411/80 |

Primary Examiner—Neill R. Wilson
Attorney, Agent, or Firm—Irving Keschner

[57] ABSTRACT

A printed circuit board wedge assembly having a center section riveted to a printed circuit board. The center section is designed to allow the wedge operating shaft running longitudinally through the wedge assembly to be positioned into the center section opening with no obstructions. A biasing spring is placed through a slot and moved in place along grooves cut into the center section. The spring captivates the operating shaft assembly to the center section and enables all the wedge sections to be aligned.

5 Claims, 2 Drawing Sheets

PRINTED CIRCUIT BOARD WEDGE SECTION RETAINER

BACKGROUND OF THE INVENTION

1. Field of the Invention

The present invention provides an improved printed circuit board mounting apparatus that includes an elongated wedge assembly that expands transversely to fasten the board in place, a spring member both captivating the operating shaft to the center section and aligning the wedge section.

2. Description of the Prior Art

Elongated wedge assemblies that expands transversely to fasten a printed circuit board (PCB) in place have been available in the prior art. For example, U.S. Pat. No. 4,775,260 discloses such a device which includes a clutch mechanism to limit the maximum torque that can be applied to the positioning screw. A biasing spring is provided to bias the wedge into longitudinal alignment. However, in order to remove the fastener forcing screw for repair or replacement purposes, the entire assembly has to be removed from the printed circuit board. U.S. Pat. No. 4,354,770 discloses a wedge assembly wherein a center wedge member is secured within an open cavity by a guide pin positioned through aligned holes formed in the housing and wedge member; U.S. Pat. Nos. 5,156,647 and 5,253,963 to Ries disclose a snap together wedge lock in which the screw assembly is retained within the main wedge by a pair of finger members. Other prior art devices pinch or crimp the walls of the main center section to captivate the screw and wedge assembly.

What is desired is to provide an improved elongated wedge assembly wherein the center wedge section remains secured to the PCB while the screw assembly, including the end wedge sections can be removed when required.

SUMMARY OF THE PRESENT INVENTION

The present invention provides a printed circuit board wedge assembly having a center section riveted to a printed circuit board. The center section is designed to allow the wedge operating shaft running longitudinally through the wedge assembly to be positioned into the center section opening with no obstructions. A biasing spring is placed through a slot and moved in place along grooves cut into the center section. The spring captivates the operating shaft to the center section and enables all the wedge sections to be aligned.

The assembly of the present invention thus enables the wedge operating shaft and attached wedge assembly center section to be easily disassembled from the main center housing which is attached to the printed circuit board, thus saving time and labor costs normally involved in removing the fastener forcing screw.

DESCRIPTION OF THE DRAWINGS

For a better understanding of the invention as well as other objects and further features thereof, reference is made to the following description which is to be read in conjunction with the accompanying drawing wherein.

DESCRIPTION OF THE INVENTION

Figure 1:
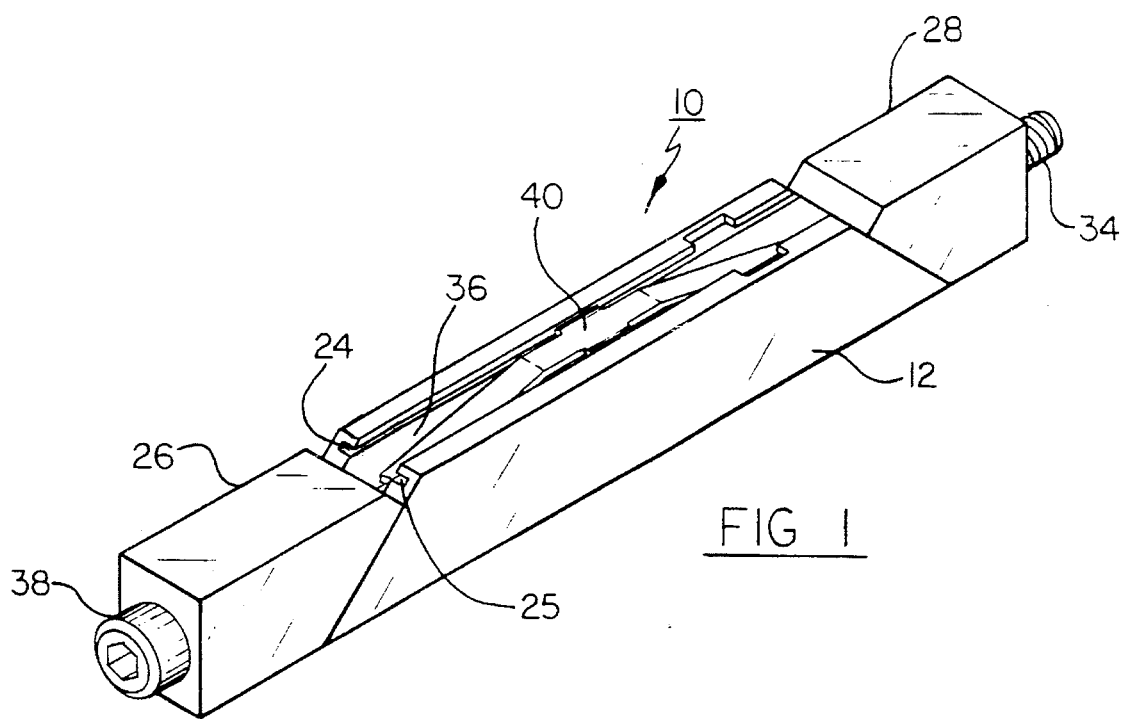
FIG. 1 is a perspective view of a locking wedge assembly in accordance with the teachings of the present invention.
Figure 2:
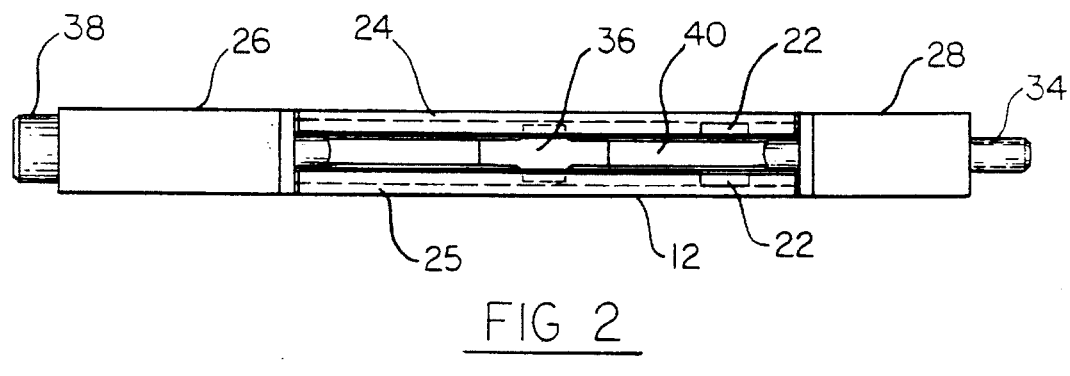
FIG. 2 is a plan view of the locking wedge assembly of FIG. 1.
Figure 3:
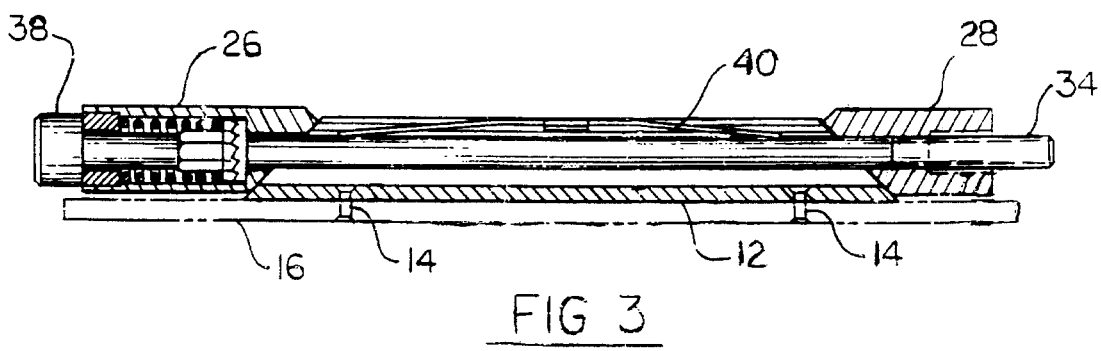
FIG. 3 is a cross-sectional elevational view of the locking wedge assembly of FIG. 1 shown fastened to a printed circuit board.
Figure 4:
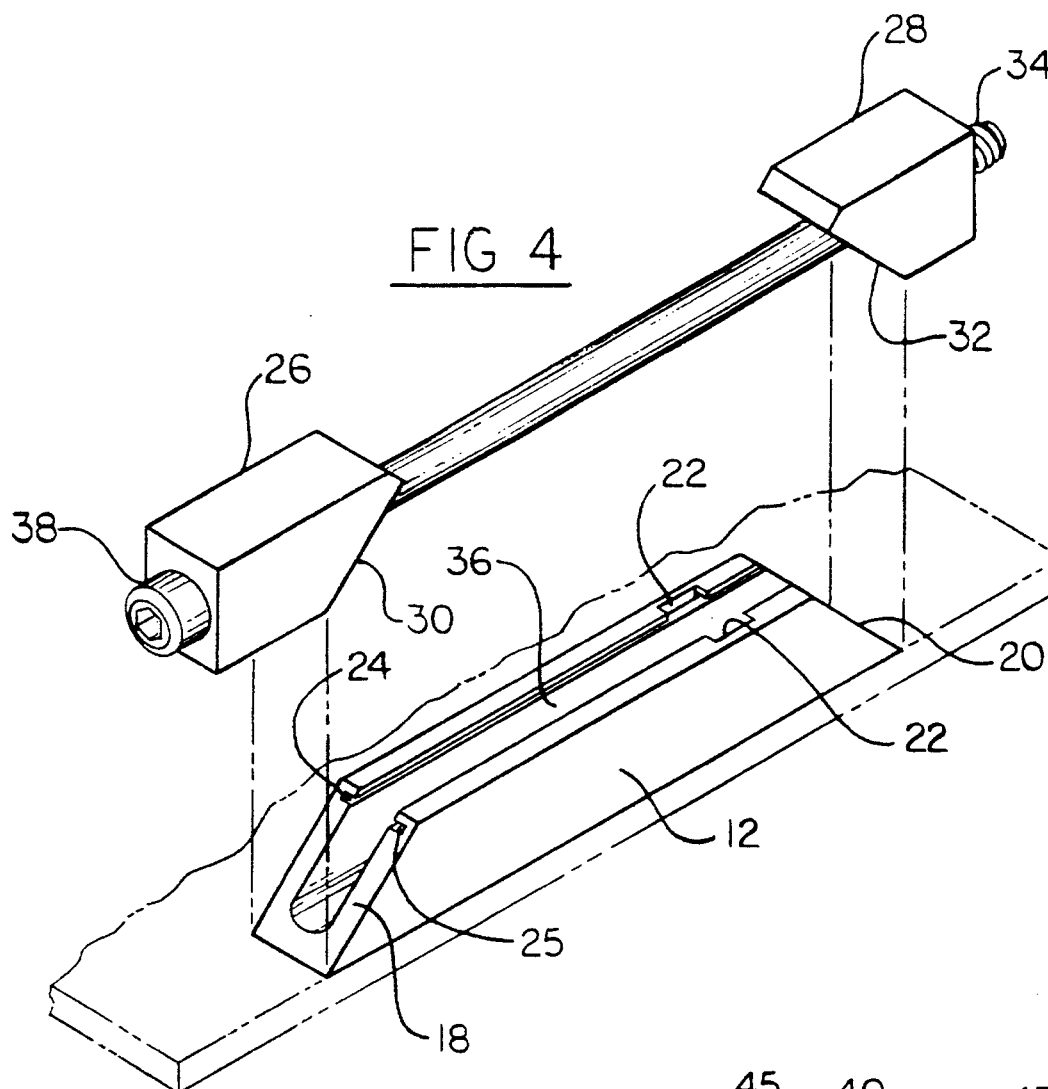
FIG. 4 illustrates the installation of the forcing screw and mounted wedges into the mounted assembly center section.
Figure 5:
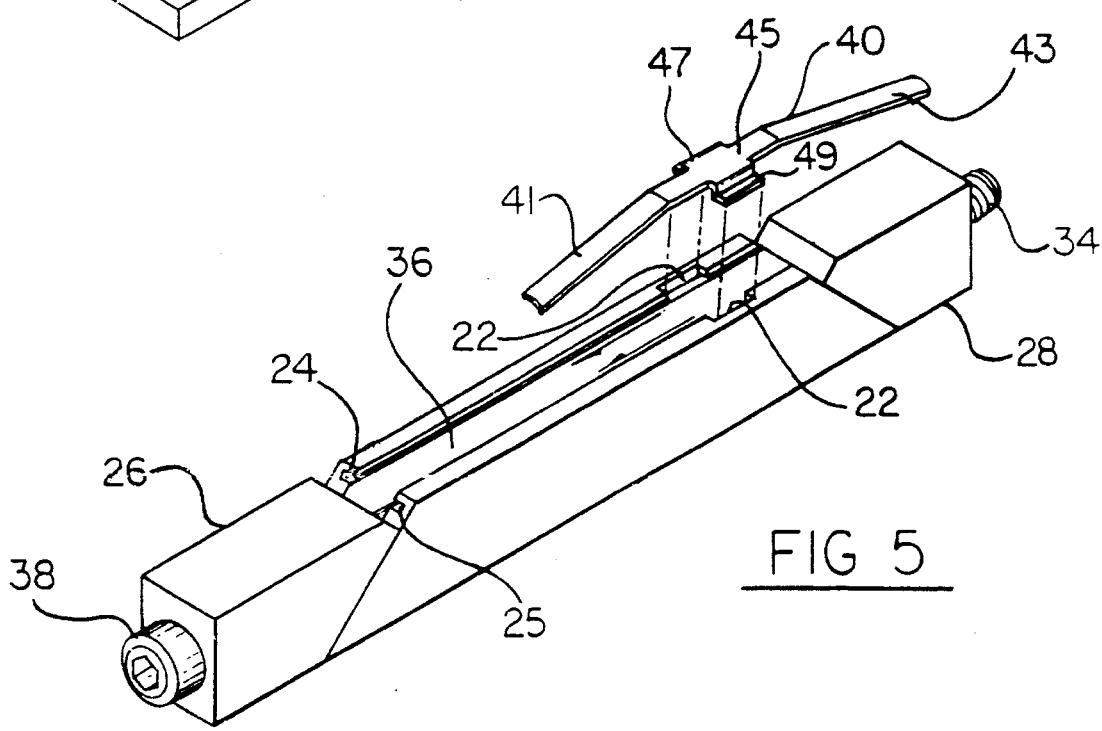
FIG. 5 illustrates the positioning of the biasing spring into grooves cut into the mounted center section.

With reference now to the drawings, there is shown a locking wedge assembly 10 formed in accordance with the teachings of the present invention, for use in retaining a printed circuit board (PCB) in an elongated slot formed in a chassis or a rack, not shown in the drawings.

The slot is of greater width than the thickness of the PCB, so as to receive both the edge of the PCB and the locking wedge assembly 10. The assembly includes an elongated center wedge 12, which can be fixed by screws or rivets 14 to the edge 16 of the PCB. Center wedge 12 includes sloped surfaces 18 and 20 at its opposite ends. In accordance with the teachings of the present invention, slots, or openings, 22 are formed in center wedge 12 as illustrated. In addition grooves 24 and 25 are formed in the center wedge section 12 along its entire length as illustrated. Cooperating first and second end wedges 26 and 28 include sloped surfaces 30 and 32, respectively, that abut against sloped surface 18 and 20, respectfully, of center wedge section 12. A wedge operating shaft, or stud assembly, 34 extends through elongated channel, or groove, 36 in the center wedge section 12 to interconnect end wedges 26 and 28. Screw head 38 bears against second end wedge 26. The remote end of screw 34 projects a short distance beyond the first end wedge 28 as illustrated. Rotating the stud assembly 34 in one direction (e.g., clockwise) draws the two end wedges 26 and 28 toward each other, causing the end wedges and the screw to deflect transversely relative to the center wedge 12. This increases the assembly's effective transverse width and, thus, locks the PCB within the slot. Conversely, rotating the stud assembly 34 in the opposite direction moves the two end wedges 26 and 28 apart from each other, to loosen the assembly and permit removal of the PCB from the slot.

In accordance with the invention, the assembly further includes a leaf type biasing spring 40 comprising elongated members, or leafs, 41 and 43, base member 45 and tabs, or flanges, 47 and 49. After longitudinal operating stud 34 is positioned in channel 36 formed in center section 12, flange 47 and 49 of spring 40 extend into slots, or recesses 22, enabling tabs 47 and 49 thereof to be positioned within grooves 24 and 25, respectfully, along the entire longitudinal extent of each groove formed in center sections 12. The leaf spring 40 is inserted into center section 12 in the following manner:

Leaf spring 40 is positioned over center section 12 with tabs 47 and 49 above slots 22, elongated members 41 and 43 extending in the direction of channel 36.

The user then pushes down on spring 40 in the middle of base member 45 such that tabs 47 and 49 are positioned in corresponding openings 22. When depressed, spring 40 slides towards wedge section 26, tabs 47 and 49 sliding in grooves 24 and 25. Spring 40 is positioned anywhere within center section 12 so that leafs 41 and 43 are resting on top of stud 34.

To remove spring 40, spring leaf 43 is lifted to clear wedge section 28 and caused to slide in that direction until tabs 47 and 49 pop up through slots 22.

Spring 40 thus functions both to captivate shaft assembly 34, and thus end wedges 26 and 28 to center section 12 and to align the end wedge sections with the center section 12 thereby facilitating initial installation of the PCB and wedge assembly into the chassis slot.

The operating shaft assembly 34 thus can be easily positioned in center section 12 since the center section is designed without any obstructions such as pinched or crimped edges.

The present invention thus provides a simple and cost effective way providing ease of assembly and removal of the fastener forcing screw that is assembled with wedge end sections and are restrained by the screw head on one end and the screw thread on the other, the center section being fixed to the PCB.

While the invention has been described with reference to its preferred embodiment, it will be understood by those skilled in the art that various changes may be made and equivalents may be substituted for elements thereof without departing from the true spirit and scope of the invention. In addition, many modifications may be made to adapt a particular situation or material to the teaching of the invention without departing from its essential teachings.

What is claimed is:

1. A wedge apparatus for locking a printed circuit board within an elongated slot in a rack comprising:

an elongated center wedge having first and second elongated wall sections and first and second end sections, said end sections having sloped surfaces, a channel being formed in said center wedge, said center wedge being secured to an edge of said printed circuit board and having grooves formed in said wall sections extending along a substantial portion of the length thereof, recesses interrupting a portion of the grooves formed in said first and second wall sections;

first and second end wedges located at opposite ends of the center wedge and having surfaces that engage the sloped surfaces of the center wedge;

a screw interconnecting the first and second end wedges, rotation of the screw in a first direction drawing the two end wedges toward each other such that the end wedges and interconnecting screw are deflected transversely by the sloped surfaces of the center wedge, to lock a printed circuit board within an elongated slot in a rack; and means for biasing said first and second end wedges into longitudinal alignment with said center wedge.

2. The apparatus of claim 1 wherein said biasing means comprises spring means.

3. The apparatus of claim 1 wherein said biasing means captivates said screw within the channel formed in said center wedge.

4. The apparatus of claim 1 wherein said biasing means has first and second elongated edges, said first elongated edge being positioned within said first groove formed in said first wall section and said second elongated edge being positioned within said second groove formed in said second wall section.

5. The apparatus of claim 4 wherein said biasing means comprises a base member having first and second flanges, said first flange extending into said first wall section recess and said second flange extending into said second wall section recess.

* * * * *